(12) United States Patent
Takahashi et al.

(10) Patent No.: US 6,747,524 B2
(45) Date of Patent: Jun. 8, 2004

(54) MODULATOR AND DEMODULATOR (75) Inventors: Hirotoshi Takahashi, Tokyo (JP); Kazuo Akaike, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 262 days.

(21) Appl. No.: 10/036,428

(22) Filed: Jan. 7, 2002

(65) Prior Publication Data

US 2003/0001782 A1 Jan. 2, 2003

(30) Foreign Application Priority Data

Jun. 27, 2001 (JP) .................................... 2001-194862

(51) Int. Cl.[7] .............................................. H03C 3/00
(52) U.S. Cl. ...................... 332/103; 332/104; 375/302
(58) Field of Search ................................. 332/100, 101, 332/102, 103, 104, 105; 375/302, 303, 304, 305, 306, 307, 308

(56) References Cited

U.S. PATENT DOCUMENTS 5,535,245 A * 7/1996 Kim ........................... 345/261
5,825,242 A * 10/1998 Prodan et al. .............. 329/304

* cited by examiner

*Primary Examiner*—Henry Choe
(74) *Attorney, Agent, or Firm*—Wenderoth, Lind & Ponack, L.L.P.

(57) ABSTRACT

A modulator for modulating carrier wave signals with an in-phase component signal and a quadrature component signal includes a fixed frequency signal generator for generating two fixed-frequency signals differing 90 degrees in phase, a variable frequency signal generator for generating a signal whose frequency can be varied according to a modulated signal, in-phase and quadrature component carrier wave signal generators for mixing respective ones of the fixed-frequency signals and the variable-frequency signal to generate carrier wave signals for in-phase and quadrature components, an in-phase component modulator for modulating the in-phase component carrier wave signal with the in-phase component signal, and a quadrature component modulator for modulating the quadrature component carrier wave with the quadrature component signal. Also, a demodulator is able to demodulate an in-phase component modulated signal and a quadrature component modulated signal from the modulator.

9 Claims, 6 Drawing Sheets

MODULATOR AND DEMODULATOR

BACKGROUND OF THE INVENTION

1. Field of the Invention

This invention relates to a modulator for modulating a carrier wave with an in-phase component (I component) signal and a quadrature component (Q component) and a demodulator for demodulating the in-phase component signal and quadrature component signal, particularly to a technology enabling broadband modulation and demodulation with simple control.

2. Description of the Prior Art

In, for example, intelligent transport systems (ITS) used to increase traffic efficiency through exchange of information among people, vehicles and roads, consideration is being given to use of software radio that uses software to send and receive wireless signals.

Wireless devices such as software radios need to be equipped with modulator and demodulator units for high-frequency and/or broadband wireless communication.

An example configuration of a modulator-demodulator unit conventionally used for analog modulation-demodulation will be explained.

Figure 5:
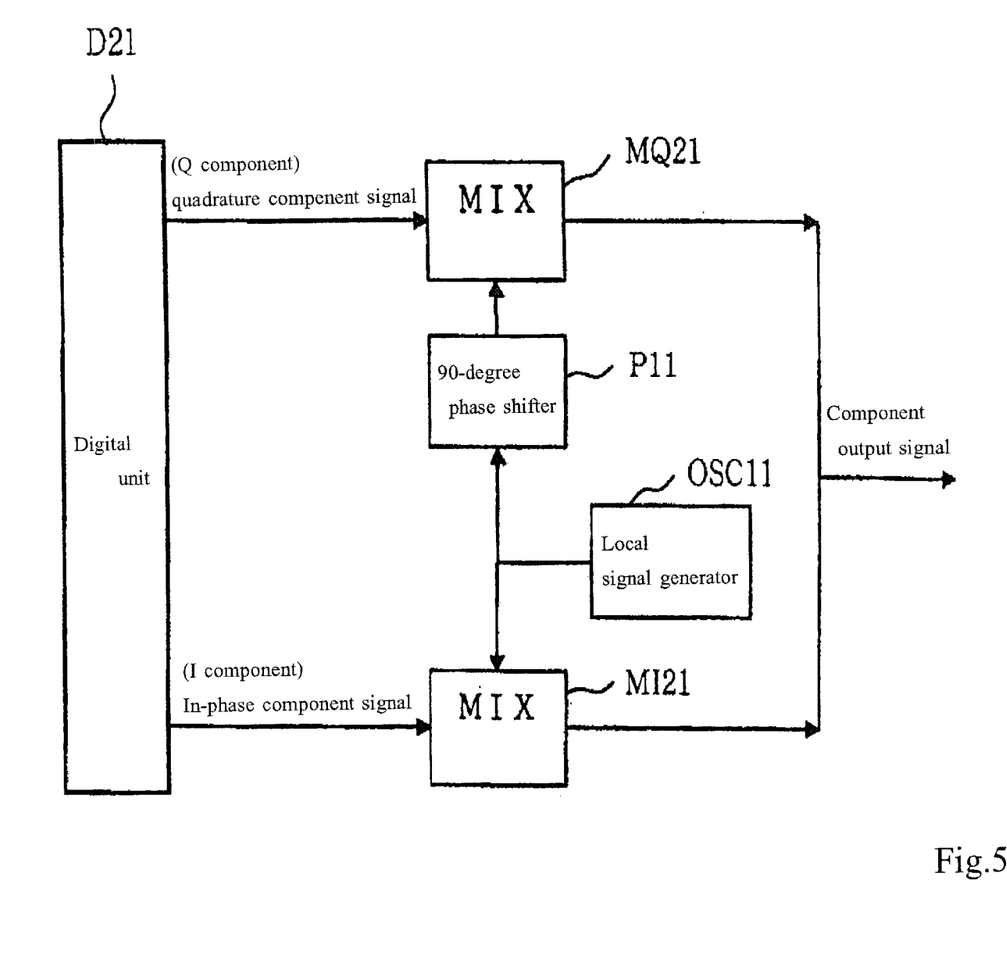
FIG. 5 is a diagram showing the configuration of a conventional analog quadrature modulator.

FIG. 5 shows the configuration of an analog quadrature modulator provided downstream of a digital unit D21. Although the digital unit D21 is included in the drawing for convenience of explanation, it should be noted that the digital unit D21 would not ordinarily be a component of an analog quadrature modulator.

In the analog quadrature modulator shown in the figure, an in-phase component signal output by the digital unit D21 is input to an in-phase component side mixer (MIX) MI21 and a quadrature component signal output by the digital unit D21 is input to a quadrature component side mixer (MIX) MQ21.

Further, in this analog quadrature modulator, a local signal generator (OSC) OSC11 generates a signal having the frequency of, for instance, a carrier wave signal ordinarily used in communication (carrier wave frequency) and the signal having this carrier wave frequency is output as an in-phase component carrier wave signal to the in-phase component side mixer MI21 without modification and the signal having the carrier wave frequency is also output to a 90-degree (°) phase shifter P11. The 90-degree phase shifter P11 shifts the signal received from the local signal generator OSC11 90 degrees and outputs the phase-shifted signal to the quadrature component side mixer MQ21 as a quadrature component carrier wave signal.

The in-phase component side mixer MI21 mixes the in-phase component carrier wave signal received from the local signal generator OSC11 and the in-phase component signal received from the digital unit D21 to modulate the in-phase component carrier wave signal with the in-phase component signal and outputs the resulting in-phase modulated component.

The quadrature component side mixer MQ21 mixes the quadrature component carrier wave signal received from the 90-degree phase shifter P11 and the quadrature component signal received from the digital unit D21 to modulate the quadrature component carrier wave signal with the quadrature component signal and outputs the resulting quadrature modulated component.

In this analog quadrature modulator, the in-phase modulated component output by the in-phase component side mixer MI21 and the quadrature modulated component output by the quadrature component side mixer MQ21 are synthesized and synthesized signal is output as a composite signal. The composite signal is a carrier wave frequency signal including, for example, amplitude information and phase information. By controlling the in-phase component signal and the quadrature component signal output by the digital unit D21 to modify the amplitude information and the phase information, data to be transmitted by frequency modulation, phase modulation and/or amplitude modulation can be transmitted on the carrier wave. In addition, the composite signal output by the analog quadrature modulator can be wirelessly transmitted to another party's wireless device as a wireless signal via an antenna or the like (not shown).

The configuration of an analog quadrature demodulator will now be explained with reference to FIG. 6.

The analog quadrature demodulator illustrated in the drawing is input with a carrier wave frequency composite signal including amplitude information or phase information, specifically with a signal transmitted wirelessly from, for example, a wireless device with which communication is to be conducted and received wirelessly via an antenna (not shown). The received composite signal is divided and input to an in-phase component side mixer MI22 and a quadrature component side mixer MQ22.

Similarly to the case of the analog quadrature modulator shown in FIG. 5, in this analog quadrature demodulator, a local signal generator (OSC) OSC12 generates a signal of, for instance, a carrier wave frequency and the signal having this carrier wave frequency is output as an in-phase component carrier wave signal to the in-phase component side mixer MI22 without modification and the signal having the carrier wave frequency is also output to a 90-degree phase shifter P12, which shifts it 90 degrees and outputs the phase-shifted signal to the quadrature component side mixer MQ22 as a quadrature component carrier wave signal.

The in-phase component side mixer MI22 mixes the in-phase component carrier wave signal received from the local signal generator OSC12 and the composite signal to demodulate the in-phase modulated component contained in the composite signal with the in-phase component carrier wave signal and outputs the in-phase component signal produced by the demodulation.

The quadrature component side mixer MQ22 mixes the quadrature component carrier wave signal received from the 90-degree phase shifter P12 and the composite signal to demodulate the quadrature modulated component contained in composite signal with the quadrature component carrier wave signal and outputs the quadrature component signal produced by the demodulation.

The in-phase component signal and the quadrature component signal output by the analog quadrature demodulator are, for example, output to a downstream digital unit (not shown) to acquire receive data based on to the in-phase component signal and the quadrature component signal.

There will now be explained a configuration for changing the carrier wave frequency used in modulation and demodulation in the analog quadrature modulator shown in FIG. 5 and the analog quadrature demodulator shown in FIG. 6.

Carrier wave frequency change is required, for example, in a wireless device or the like that sends and receives wireless signals by switching among and using carriers of different frequencies spread over a broad band.

Figure 6:
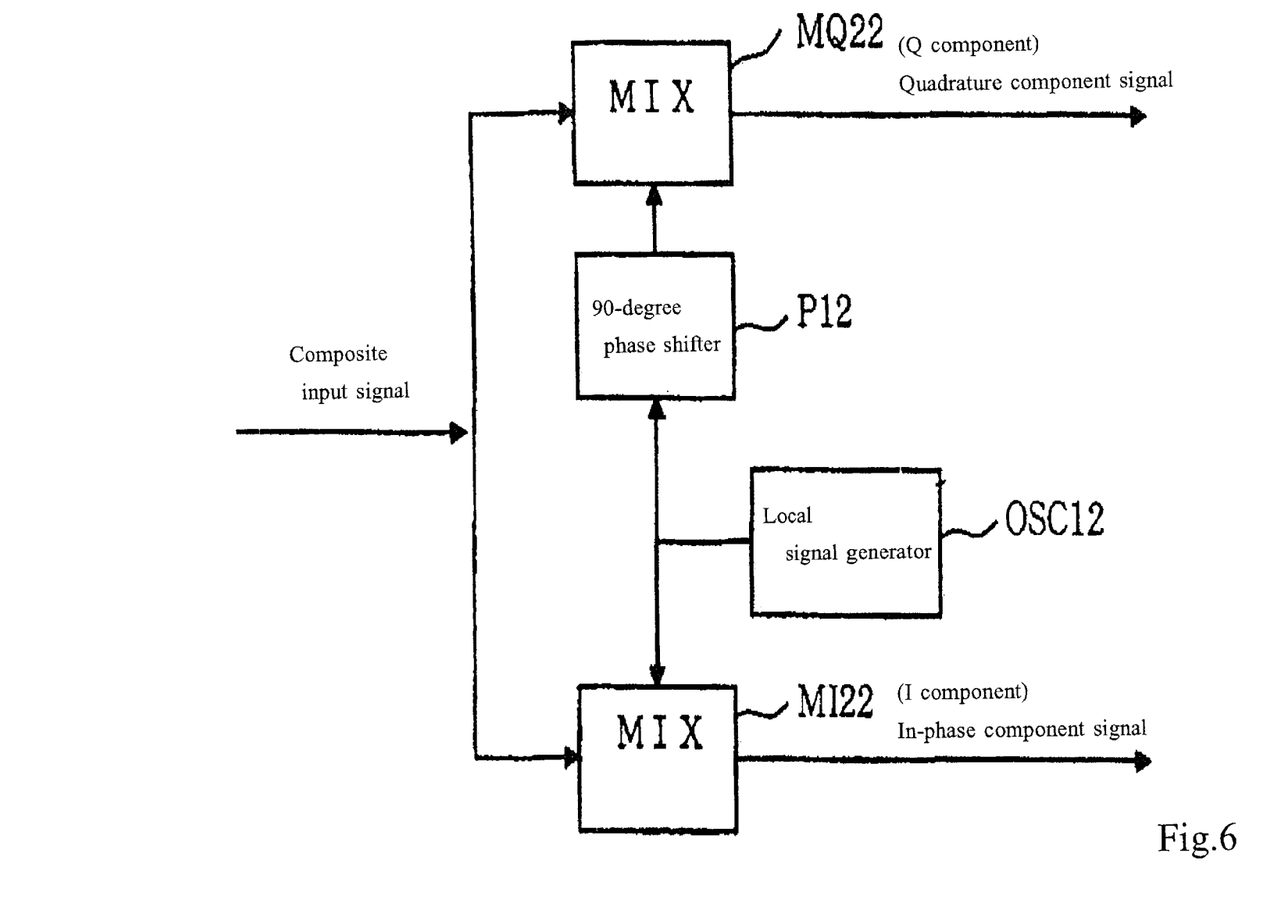
FIG. 6 is a diagram showing the configuration of a conventional analog quadrature demodulator.

In the analog quadrature modulator shown in FIG. 5 and the analog quadrature demodulator shown in FIG. 6, a configuration enabling carrier wave frequency change can conceivably be implemented, for instance, by installing voltage-controlled oscillators (VCOs) in place of the local signal generators OSC11 and OSC12 and controlling the voltage applied to the voltage-controlled oscillators to change the frequency of the signals (local signals) output from the voltage-controlled oscillator to the in-phase component side mixers MI21, MI22 and the 90-degree phase shifters P11, P12. With this configuration, however, the fact that the devices constituting the 90-degree phase shifters P11, P12 have frequency characteristics would make it possible to achieve accurate 90-degree phase shift only in a relatively narrow band, i.e., frequencies would be present in the required broad band at which a phase shift greater than 90 degrees or less than 90 degrees arose, making modulation-demodulation impossible over a broad band.

While it is conceivable to overcome this problem by providing multiple 90-degree phase shifters associated with different frequencies and using a switch or the like to switch to the one to be used at each frequency, this configuration would complicate the control, raise cost and increase circuit size, because it would require provision of phase shifters for the individual frequencies and also increase the number of control system signals.

In the modulator taught by JP-A-HEI-5-207080, for example, a synthesizer generates a frequency signal for each channel and, at the time of shifting the phase of the synthesizer output 90 degrees using a variable 90-degree phase shifter, the variable 90-degree phase shifter is controlled to make the error of a detected quadrature phase zero. However, this configuration requires a circuit for detecting quadrature phase and a circuit for controlling the 90-degree phase shifter to make the quadrature phase error zero. Control therefore becomes complicated and, moreover, it is difficult to achieve high accuracy with the variable phase shifter in a high-frequency band such as the quasi-microwave band.

In the quadrature phase signal generator circuit taught by JP-A-HEI-10-243037, for example, in order to cause a voltage-controlled oscillator (VCO) to generate a signal whose phase is 90 degrees different from that of a signal output by a local oscillator (local signal), the voltage-controlled oscillator is controlled based on a comparison of the frequency difference and phase difference of the two signals. With this configuration, however, when multiple channels are used, for example, the frequency of the signal output by the voltage-controlled oscillator must be controlled every time the frequency of the local signal is switched, and phase control of the signal is also necessary. The control therefore becomes complicated.

As explained with regard to the prior art, in a conventional modulator like that shown in FIG. 5 or demodulator like that shown in FIG. 6, modulation or demodulation over a broad band entails complex control, requires large circuitry and increases cost.

The present invention was accomplished in light of such problems of the prior art and has as its object to provide a modulator that when modulating a carrier wave with an in-phase component signal and a quadrature component signal can achieve broadband modulation with simple control.

Another object of the present invention is to provide a demodulator that when demodulating a carrier wave frequency composite signal into an in-phase component signal and a quadrature component signal can achieve broadband demodulation with simple control.

The modulator and demodulator according to the present invention enable reduction of circuit size and cost in comparison with the prior art.

SUMMARY OF THE INVENTION

In order to achieve the foregoing object, the modulator according to the invention modulates a carrier wave signal for a carrier wave signal with an in-phase component signal and modulates a carrier wave signal for a quadrature component with a quadrature component signal, in the following manner.

Specifically, a fixed frequency signal generating means generates two signals of fixed frequency differing 90 degrees in phase, a variable frequency signal generating means generates a signal whose frequency can be varied according to a modulated signal to be produced, an in-phase component carrier wave signal generating means mixes one signal generated by the fixed frequency signal generating means and the signal generated by the variable frequency signal generating means to generate a carrier wave signal for an in-phase component, a quadrature component carrier wave signal generating means mixes the other signal generated by the fixed frequency signal generating means and the signal generated by the variable frequency signal generating means to generate a carrier wave signal for a quadrature component, an in-phase component modulating means modulates the in-phase component carrier wave signal generated by the in-phase component carrier wave signal generating means with the in-phase component signal and a quadrature component modulating means modulates the quadrature component carrier wave signal generated by the quadrature component carrier wave signal generating means with the quadrature component signal.

Therefore, since two fixed-frequency signals that differ 90 degrees in phase are generated, it is easy to ensure that the phase difference between the two signals is exactly 90 degrees. In addition, since the frequency of the signal generated by the variable frequency signal generating means according to the frequency of the modulated signal to be produced can be controlled and changed so as to change the frequency of the carrier wave signals for the in-phase component and the quadrature component, broadband modulation can be achieved with simple control.

The fixed frequency signal generating means can, for example, be constituted using a digital unit or be constituted using a local signal oscillator and a 90-degree phase shifter.

In one configuration of the modulator according to the present invention, the fixed frequency signal generating means is constituted using a local signal oscillator that generates a fixed frequency and a 90-degree phase shifter that shifts the phase of the signal generated by the local signal oscillator 90 degrees. In this case, one or the other of the signal generated by the local signal oscillator and the signal phase-shifted by the 90-degree phase shifter is mixed by the in-phase component carrier wave signal generating means and the remaining signal is mixed by the quadrature component carrier wave signal generating means.

As the carrier wave signal for the in-phase component or the quadrature component there is, for example, used a signal having the frequency of a carrier wave ordinarily used in communication and when multiple carrier wave frequencies are used, the multiple carrier wave frequency signals are switched according to, for example, the communication conditions.

The fixed frequency is not particularly limited and can be set at any of various values based on the use conditions of the modulator.

The control for changing the frequency of the signal generated by the variable frequency signal generating means according to the frequency of the modulated signal to be produced is ordinarily conducted in a mode of matching with the frequency of the carrier wave used for communication, i.e. for transmission of the frequency of the generated in-phase component carrier wave signal or the frequency of the generated quadrature component carrier wave signal.

The signal generated by the variable frequency signal generating means is divided into two signals having the same phase, one divided signal is mixed by the in-phase component carrier wave signal generating means, and the other divided signal is mixed by the quadrature component carrier wave signal generating means.

When the in-phase component carrier wave signal generating means or the quadrature component carrier wave signal generating means generates the in-phase component carrier wave signal or the quadrature component carrier wave signal, unnecessary frequency components are preferably removed from the mixing result of the means by a filter.

The in-phase component modulating means and the quadrature component modulating means are, for example, constituted as mixers. For example, the in-phase component carrier wave signal and the in-phase component signal are mixed to produce an in-phase modulated component, and the quadrature component carrier wave signal and the quadrature component signal are mixed to produce a quadrature modulated component. The in-phase modulated component and the quadrature modulated component are, for example, synthesized to obtain a composite signal including amplitude information or phase information.

Further, the demodulator according to the invention demodulates an in-phase component modulated signal with an in-phase component carrier wave signal to produce an in-phase component signal, and demodulates a quadrature component modulated signal with a quadrature component carrier wave signal to produce a quadrature component signal, in the following manner.

Specifically, a fixed frequency signal generating means generates two signals of fixed frequency differing 90 degrees in phase, a variable frequency signal generating means generates a signal whose frequency can be varied according to a modulated signal, an in-phase component carrier wave signal generating means mixes one signal generated by the fixed frequency signal generating means and the signal generated by the variable frequency signal generating means to generate a carrier wave signal for an in-phase component, a quadrature component carrier wave signal generating means mixes the other signal generated by the fixed frequency signal generating means and the signal generated by the variable frequency signal generating means to generate a carrier wave signal for a quadrature component, an in-phase component demodulating means demodulates an in-phase component modulated signal with the in-phase component carrier wave signal generated by the in-phase component carrier wave signal generating means to produce an in-phase component signal, and a quadrature component demodulating means demodulates a quadrature component modulated signal with the quadrature component carrier wave signal generated by the quadrature component carrier wave signal generating means to produce a quadrature component signal.

Therefore, since two fixed-frequency signals that differ 90 degrees in phase are generated, it is easy to ensure that the phase difference between the two signals is exactly 90 degrees. In addition, since the frequency of the signal generated by the variable frequency signal generating means according to the frequency of the modulated signal to be demodulated can be controlled and changed so as to change the frequency of the carrier wave signals for the in-phase component and the quadrature component, broadband demodulation can be achieved with simple control.

The fixed frequency signal generating means can, for example, be constituted using a digital unit or be constituted using a local signal oscillator and a 90-degree phase shifter.

In one configuration of the demodulator according to the present invention, the fixed frequency signal generating means is constituted using a local signal oscillator that generates a fixed frequency and a 90-degree phase shifter that shifts the phase of the signal generated by the local signal oscillator 90 degrees. In this case, one or the other of the signals generated by the local signal oscillator and the signal phase-shifted by the 90-degree phase shifter is mixed by the in-phase component carrier wave signal generating means and the remaining signal is mixed by the quadrature component carrier wave signal generating means.

Although the general practice is for the in-phase component modulated signal or the quadrature component modulated signal to be processed for demodulation in the form of, for example, a composite signal synthesizing the two component modulated signals, the two component modulated signals can instead be processed in the form of separate signals. In this case, too, the component signal of each component modulated signal can be demodulated with the corresponding component carrier wave signal.

As the carrier wave signal for the in-phase component or the quadrature component there is, for example, used a signal having the same frequency as the in-phase component or quadrature component modulated signal to be demodulated and when modulated signals of multiple frequencies are demodulated, the carrier wave signals of these multiple frequencies are switched according to, for example, the communication conditions.

The fixed frequency is not particularly limited and can be set at any of various values based on the use conditions of the demodulator.

The control for changing the frequency of the signal generated by the variable frequency signal generating means according to the frequency of the demodulated is ordinarily conducted in a mode of matching the frequency of the generated in-phase component carrier wave signal or the frequency of the generated quadrature component carrier wave signal with the frequency of the modulated signal to be demodulated.

The signal generated by the variable frequency signal generating means is divided into two signals having the same phase, one divided signal is mixed by the in-phase component carrier wave signal generating means, and the other divided signal is mixed by the quadrature component carrier wave signal generating means.

When the in-phase component carrier wave signal generating means or the quadrature component carrier wave signal generating means generates the in-phase component carrier wave signal or the quadrature component carrier wave signal, unnecessary frequency components are preferably removed from the mixing result of the means by a filter.

The in-phase component modulating means and the quadrature component modulating means are, for example, constituted as mixers. For example, the in-phase component carrier wave signal and the in-phase component modulated signal are mixed to produce an in-phase component signal as an in-phase component demodulation result and the quadrature component carrier wave signal and the quadrature component modulated signal are mixed to produce a quadrature component signal as a quadrature component demodulation result, and receive data are acquired from the in-phase component signal and the quadrature component signal.

DESCRIPTION OF THE PREFERRED EMBODIMENTS

Embodiments of the present invention will now be explained with reference to the drawings.

A demodulator that is a first embodiment of the invention will be explained first.

Figure 1:
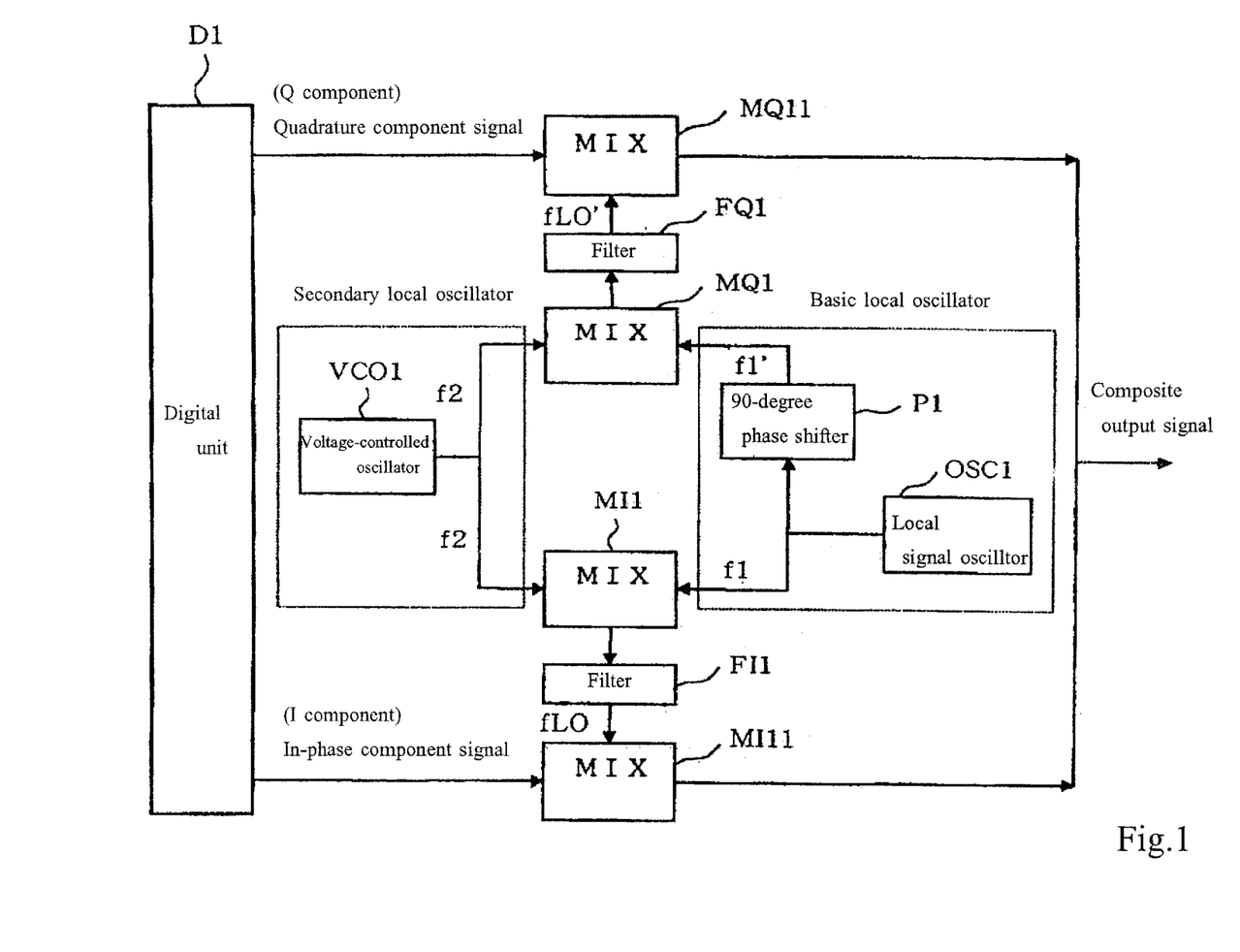
FIG. 1 is a diagram showing the configuration of an analog quadrature modulator that is a first embodiment of the present invention.

FIG. 1 shows the configuration of the analog quadrature modulator of this embodiment provided downstream of a digital unit D1. Although the digital unit D1 is included in the drawing for convenience of explanation, it should be noted that the digital unit D1 is not ordinarily a component of the analog quadrature modulator.

The illustrated analog quadrature modulator of this embodiment comprises a local signal oscillator OSC1 and a 90-degree phase shifter P1 that constitute a processing unit for generating a basic local signal, a voltage-controlled oscillator VCO1 constituting a processing unit for generating a secondary local signal, an in-phase component side first mixer MI1, filter FI1 and second mixer MI11, and a quadrature component side first mixer MQ1, filter FQ1 and second mixer MQ11. In the analog quadrature modulator of this embodiment, an in-phase component signal output by the digital unit D1 is input to the in-phase component side second mixer MI11 and a quadrature component signal output by the digital unit D1 is input to the quadrature component side second mixer MQ11.

The local signal oscillator OSC1 generates a signal (basic local signal) f1 whose frequency constitutes a basic carrier wave frequency and outputs the signal f1 to the 90-degree phase shifter P1 and the in-phase component side first mixer MI1. The basic carrier wave frequency has a fixed frequency, e.g., has a frequency preset to avoid spurious interference and the like.

The 90-degree phase shifter P1 shifts the phase of the signal f1 received from the local signal oscillator OSC1 90 degrees and outputs the phase-shifted signal f1' to the quadrature component side first mixer MQ1.

The voltage applied to the voltage-controlled oscillator VCO1 is, for example, controlled by a control unit provided in the voltage-controlled oscillator VCO1 so as to generate a signal (secondary local signal) f2 having a frequency corresponding to the applied voltage. The signal f2 is output to the in-phase component side first mixer MI1 and the quadrature component side first mixer MQ1. The frequency of the signal f2 generated by the voltage-controlled oscillator VCO1 is controlled based on the frequency of the modulated signal to be generated, i.e., the frequency used for communication (transmission). The functional means for controlling the frequency of the voltage-controlled oscillator VCO1 based on the modulated signal to be generated can, for example, be provided at an arbitrary location in the communication device equipped with the analog quadrature modulator of this embodiment.

One or both of the transmission lines from the voltage-controlled oscillator VCO1 to the in-phase component side first mixer MI1 and the quadrature component side first mixer MQ1 is/are finely adjusted in the length of the path pattern, for example, so as to set the two transmission lines to the same phase. In other words, they are set to make the phase of the signal f2 sent from the voltage-controlled oscillator VCO1 to the in-phase component side first mixer MI1 and the phase of the signal f2 sent from the voltage-controlled oscillator VCO1 to the quadrature component side first mixer MQ1 identical.

The in-phase component side first mixer MI1 mixes the signal f1 received from the local signal oscillator OSC1 and the signal f2 received from the voltage-controlled oscillator VCO1 and outputs the mixing result to the in-phase component side filter FI1. The mixing result output from the first mixer MI1 to the filter FI1 includes, for example, a signal having a frequency corresponding to the difference |F1−F2| between the frequency F1 of the signal f1 from the local signal oscillator OSC1 and the frequency F2 of the signal f2 from the voltage-controlled oscillator VCO1 (difference frequency signal) and signal having a frequency corresponding to the sum |F1+F2| of the frequencies F1 and F2 (sum frequency signal). It also includes, for example, leaked signals from the signals f1, f2 received by the first mixer MI1 that have frequencies F1, F2 identical with those of the received signals f1, f2 (local leak frequency signals).

The in-phase component side filter FI1 removes unnecessary frequency components from the mixing result received from the in-phase component side first mixer MI1 by filtering and outputs the filtered signal fLO to the in-phase component side second mixer MI11 as an in-phase component carrier wave signal. In this embodiment, one or the other of the aforesaid difference frequency signal and sum frequency signal is output to the second mixer MI11 as the in-phase component carrier wave signal fLO removed of unnecessary frequency components. On the other hand, the remaining one of the difference frequency signal and the sum frequency signal (the image frequency signal component) is removed as an unnecessary frequency component by the filter FI1 and the characteristics of the filter FI1 are set so that the local leak frequency signals are also removed by the filter FI1.

An ordinary band-pass filter or any of various other filters can be used for the filter FI1. When the image frequency is high, for example, a low-pass filter can be used, and when the image frequency is low, a high-pass filter can be used.

The in-phase component side second mixer MI11 mixes the in-phase component carrier wave signal fLO received from the in-phase component side filter FI1 and an in-phase component signal received from the digital unit D1 and outputs the result of modulating the in-phase component carrier wave signal with the in-phase component signal as an in-phase modulated component.

The quadrature component side first mixer MQ1, filter FQ1 and second mixer MQ11 conduct processing similar to that conducted by the in-phase component side first mixer MI1, filter FI1 and second mixer MI1.

Specifically, the quadrature component side first mixer MQ1 mixes the signal f1' received from the 90-degree phase shifter P1 and the signal f2 received from the voltage-controlled oscillator VCO1 and outputs the mixing result to the quadrature component side filter FQ1.

The quadrature component side filter FQ1, which may have the same frequency characteristics as the in-phase component side filter FI1, removes unnecessary frequency components from the mixing result received from the quadrature component side first mixer MQ1 by filtering and outputs the filtered signal fLO' to the quadrature component side second mixer MQ11 as a quadrature component carrier wave signal. As the quadrature component carrier wave signal there is used, for example, a signal that has the same frequency and amplitude as the in-phase component carrier wave signal but whose phase is shifted 90 degrees relative thereto.

The quadrature component side second mixer MQ11 mixes the quadrature component carrier wave signal fLO' received from the quadrature component side filter FQ1 and a quadrature component signal received from the digital unit D1 and outputs the result of modulating the quadrature component carrier wave signal with the quadrature component signal as a quadrature modulated component.

The in-phase modulated component output by the in-phase component side second mixer MI11 and the quadrature modulated component output by the quadrature component side second mixer MQ11 are then synthesized by a synthesizer (not shown), for example, and the synthesis result is output as a composite signal. The composite signal output by the analog quadrature modulator of this embodiment is wirelessly transmitted from an antenna (not shown) to, for instance, the wireless device of another party with which communication is to be conducted. The frequency of the composite signal output by the analog quadrature modulator of this embodiment is changed according to the communication conditions and the like by controlling the voltage-controlled oscillator VCO1 to vary the frequency thereof. This enables modulation over a broad band, The analog quadrature modulator according to this embodiment can thus conduct modulation over a broad frequency range by simple control even when incorporated in a wireless device or the like that transmits/receives signals over a broad band, without increasing the number of control system signals, cost or circuit size. Since the frequency of the signal f1 whose phase is shifted by the 90-degree phase shifter P1 is fixed, moreover, the accuracy of the 90-degree phase shift by the 90-degree phase shifter P1 can be ensured. The analog quadrature modulator according this embodiment can, for example, control the modulation processing over a broad band merely by conventional frequency control, e.g., by controlling the frequency of the voltage-controlled oscillator VCO1 according to the frequency of the composite signal to be generated.

In this embodiment, the local signal oscillator OSC1 and the 90-degree phase shifter P1 constitute the fixed frequency signal generating means, the voltage-controlled oscillator VCO1 constitutes the variable frequency signal generating means, the in-phase component side first mixer MI1 and filter FI1 constitute the in-phase component carrier wave signal generating means, the quadrature component side first mixer MQ1 and filter FQ1 constitute the quadrature component carrier wave signal generating means, the in-phase component side second mixer MI11 constitutes the in-phase component modulating means, and the quadrature component side second mixer MQ11 constitutes the quadrature component modulating means.

A modulator that is a second embodiment of the invention will now be explained.

Figure 2:
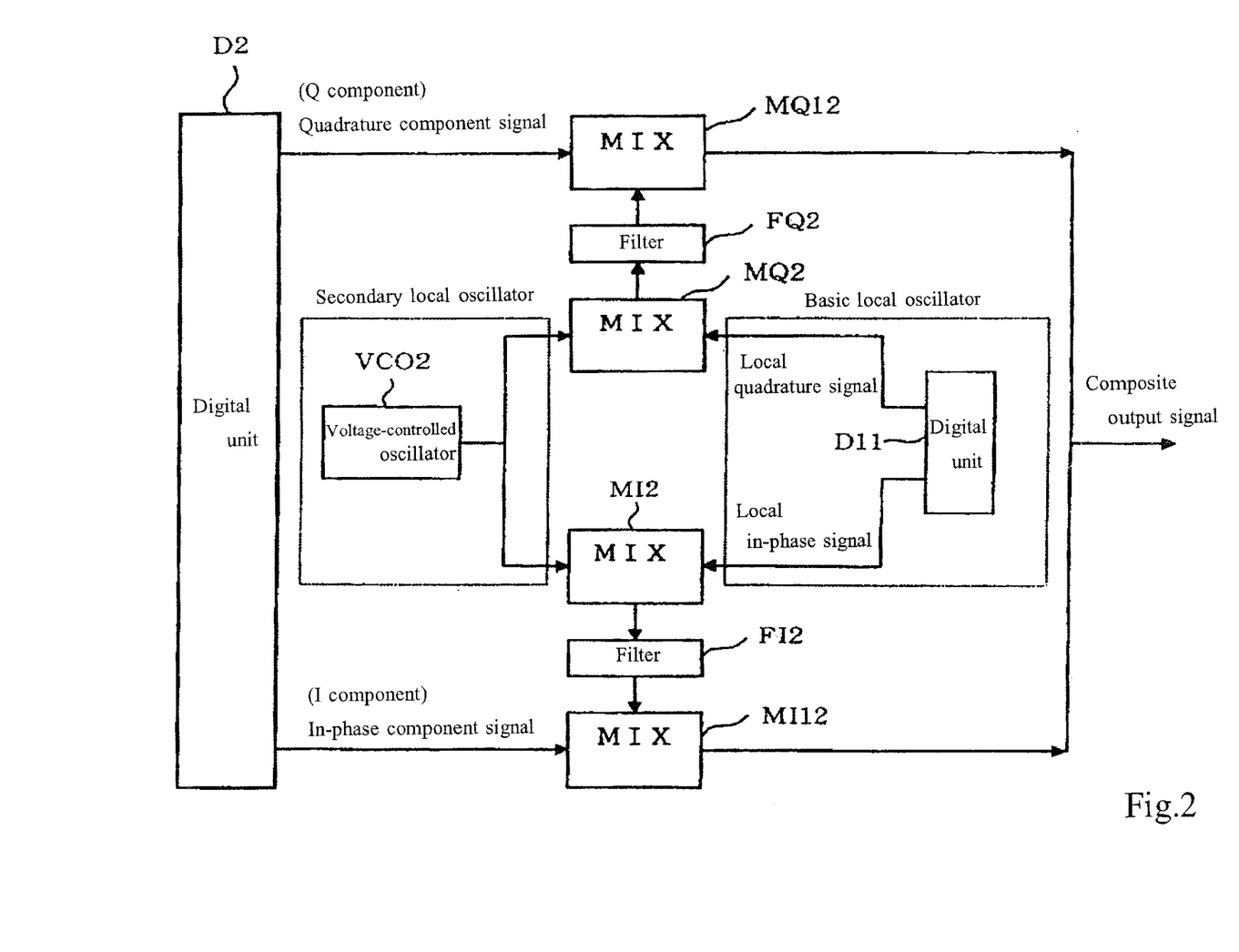
FIG. 2 is a diagram showing the configuration of an analog quadrature modulator that is a second embodiment of the present invention.

FIG. 2 shows the configuration of the analog quadrature modulator of this embodiment provided downstream of a digital unit D2. Although the digital unit D2 is included in the drawing for convenience of explanation, it should be noted that the digital unit D2 is not ordinarily a component of the analog quadrature modulator.

The illustrated analog quadrature modulator of this embodiment comprises a digital unit D11 constituting a processing unit for generating a basic local signal, a voltage-controlled oscillator VCO2 constituting a processing unit for generating a secondary local signal, an in-phase component side first mixer MI2, filter FI2 and second mixer MI12, and a quadrature component side first mixer MQ2, filter FQ2 and second mixer MQ12. In the analog quadrature modulator of this embodiment, an in-phase component signal output by the digital unit D2 is input to the in-phase component side second mixer MI12 and a quadrature component signal output by the digital unit D2 is input to the quadrature component side second mixer MQ12.

The configuration and operation of the analog quadrature modulator of this embodiment are the same as the configuration and operation of the analog quadrature modulator according to the first embodiment shown in FIG. 1, except for the point that the digital unit D11 generates the basic carrier wave frequency signal f1 and outputs the signal f1 to the in-phase component side first mixer MI2 and the point that the digital unit D11 generates the signal f1' equivalent to a signal obtained by shifting the phase of the signal f1 90 degrees and outputs the signal f1' to the quadrature component side first mixer MQ2, i.e., except for the configuration for generating the basic local signal.

In this embodiment, since the frequencies of the basic local signals f1, f1' input to the in-phase component side first mixer MI2 and the quadrature component side first mixer MQ2 are fixed, when the frequency is a relatively low one of, for example, 100 MHz or lower, it is easily possible, in consideration of spurious interference and the like, to have the digital unit D11 output the basic local signal f1 for the in-phase component and the basic local signal f1' for the quadrature component as digital signals.

Thus the analog quadrature modulator according to this embodiment can, as was explained earlier regarding the analog quadrature modulator according to the first embodiment, also conduct modulation over a wide band with simple control.

In this embodiment, the digital unit D11 constitutes the fixed frequency signal generating means.

A demodulator that is a third embodiment of the present invention will now be explained.

Figure 3:
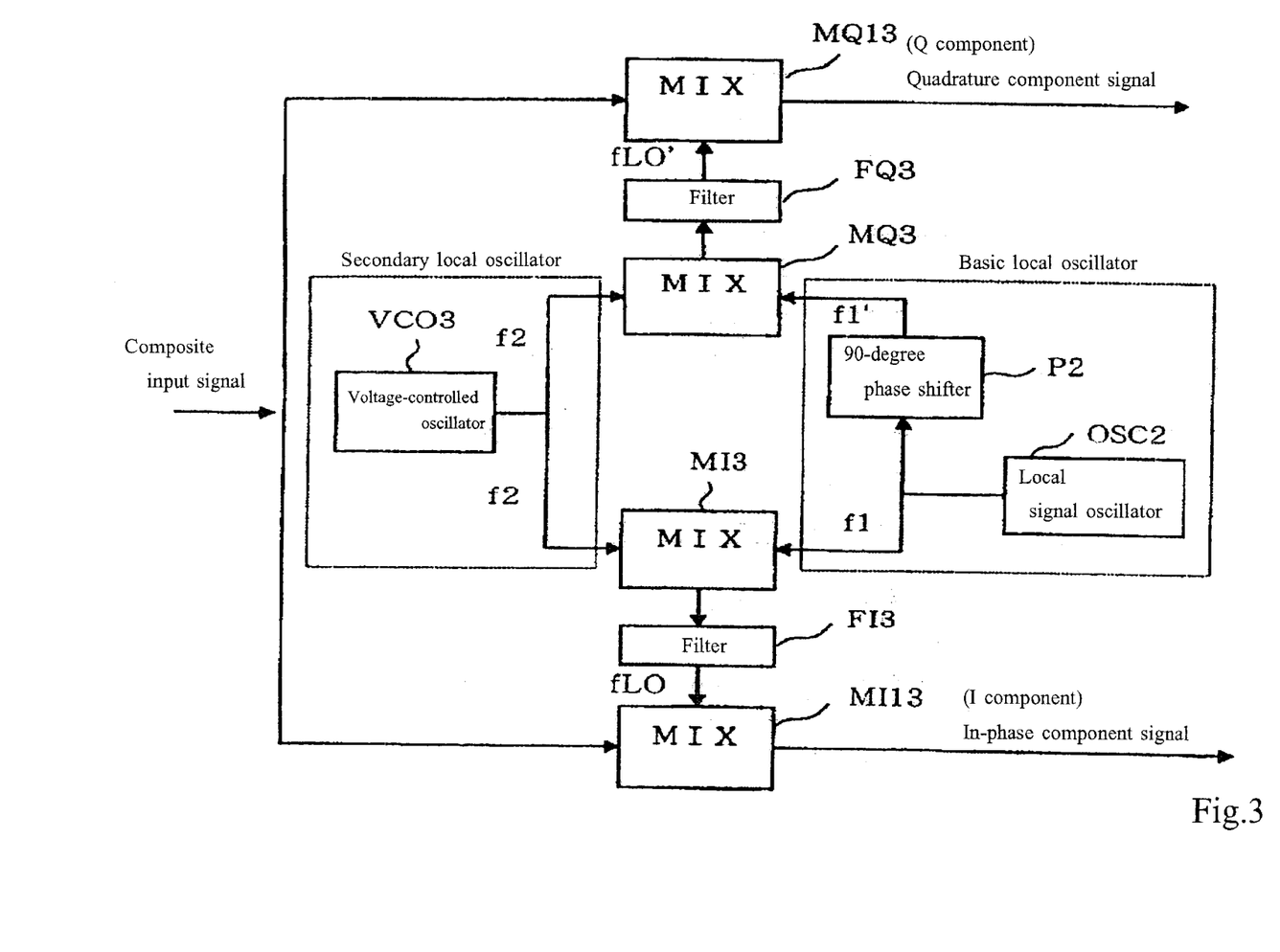
FIG. 3 is a diagram showing the configuration of an analog quadrature demodulator that is a third embodiment of the present invention.

FIG. 3 shows the configuration of the analog quadrature demodulator of this embodiment.

The illustrated analog quadrature demodulator of this embodiment comprises a local signal oscillator OSC2 and a 90-degree phase shifter P2 that constitute a processing unit for generating a basic local signal, a voltage-controlled oscillator VCO3 constituting a processing unit for generating a secondary local signal, an in-phase component side first mixer MI3, filter FI3 and second mixer MI13, and a quadrature component side first mixer MQ3, filter FQ3 and second mixer MQ13. The analog quadrature demodulator of this embodiment is input with a composite signal transmitted wirelessly from, for example, a wireless device with which communication is to be conducted and received wirelessly via an antenna (not shown). The composite signal is divided by a distributor (not shown), for example. One divided signal is input to the in-phase component side second mixer MI13 and the other divided signal is input to the quadrature component side second mixer MQ13.

The local signal oscillator OSC2 generates a signal (basic local signal) f1 whose frequency constitutes a basic carrier wave frequency and outputs the signal f1 to the 90-degree phase shifter P2 and the in-phase component side first mixer MI3. The basic carrier wave frequency has a fixed frequency, e.g., has a frequency preset to avoid spurious interference and the like.

The 90-degree phase shifter P2 shifts the phase of the signal f1 received from the local signal oscillator OSC2 90 degrees and outputs the phase-shifted signal f1' to the quadrature component side first mixer MQ3.

The voltage applied to the voltage-controlled oscillator VCO3 is, for example, controlled by a control unit provided in the voltage-controlled oscillator VCO3 so as to generate a signal (secondary local signal) f2 having a frequency corresponding to the applied voltage. The signal f2 is output to the in-phase component side first mixer MI3 and the quadrature component side first mixer MQ3. The frequency of the signal f2 generated by the voltage-controlled oscillator VCO3 is controlled based on the frequency of the input composite signal, i.e., the frequency of the signal to be received. The functional means for controlling the frequency of the voltage-controlled oscillator VCO3 based on the composite signal can, for example, be provided at an arbitrary location in the communication device equipped with the analog quadrature demodulator of this embodiment.

One or both of the transmission lines from the voltage-controlled oscillator VCO3 to the in-phase component side first mixer MI3 and the quadrature component side first mixer MQ3 is/are finely adjusted in the length of the path pattern, for example, so as to set the two transmission lines to the same phase. In other words, they are set to make the phase of the signal f2 sent from the voltage-controlled oscillator VCO3 to the in-phase component side first mixer MI3 and the phase of the signal f2 sent from the voltage-controlled oscillator VCO3 to the quadrature component side first mixer MQ3 identical.

The in-phase component side first mixer MI3 mixes the signal f1 received from the local signal oscillator OSC2 and the signal f2 received from the voltage-controlled oscillator VCO3 and outputs the mixing result to the in-phase component side filter FI3. The mixing result output from the first mixer MI3 to the filter FI3 includes, for example, a signal having a frequency corresponding to the difference |F1−F2| between the frequency F1 of the signal f1 from the local signal oscillator OSC2 and the frequency F2 of the signal f2 from the voltage-controlled oscillator VCO3 (difference frequency signal) and signal having a frequency corresponding to the sum |F1+F2| of the frequencies F1 and F2 (sum frequency signal). It also includes, for example, leaked signals from the signals f1, f2 received by the first mixer MI3 that have frequencies F1, F2 identical with those of the received signals f1, f2 (local leak frequency signals).

The in-phase component side filter FI3 removes unnecessary frequency components from the mixing result received from the in-phase component side first mixer MI3 by filtering and outputs the filtered signal fLO to the in-phase component side second mixer MI13 as an in-phase component carrier wave signal. In this embodiment, one or the other of the aforesaid difference frequency signal and sum frequency signal is output to the second mixer MI13 as the in-phase component carrier wave signal fLO removed of unnecessary frequency components. On the other hand, the remaining one of the difference frequency signal and the sum frequency signal (the image frequency signal component) is removed as an unnecessary frequency component by the filter FI3 and the characteristics of the filter FI3 are set so that the local leak frequency signals are also removed by the filter FI3.

An ordinary band-pass filter or any of various other filters can be used for the filter FI3. When the image frequency is high, for example, a low-pass filter can be used, and when the image frequency is low, a high-pass filter can be used.

The in-phase component side second mixer MI13 mixes the in-phase component carrier wave signal fLO received from the in-phase component side filter FI3 and the composite signal to demodulate the composite signal with the in-phase component carrier wave signal fLO and outputs the in-phase component signal produced by the demodulation.

The quadrature component side first mixer MQ3, filter FQ3 and second mixer MQ13 conduct processing similar to that conducted by the in-phase component side first mixer MI3, filter FI3 and second mixer MI13.

Specifically, the quadrature component side first mixer MQ3 mixes the signal f1' received from the 90-degree phase shifter P2 and the signal f2 received from the voltage-controlled oscillator VCO3 and outputs the mixing result to the quadrature component side filter FQ3.

The quadrature component side filter FQ3, which may have the same frequency characteristics as the in-phase component side filter FI3, removes unnecessary frequency components from the mixing result received from the quadrature component side first mixer MQ3 by filtering and outputs the filtered signal fLO' to the quadrature component side second mixer MQ13 as a quadrature component carrier wave signal. As the quadrature component carrier wave signal there is used, for example, a signal that has the same frequency and amplitude as the in-phase component carrier wave signal but whose phase is shifted 90 degrees relative thereto.

The quadrature component side second mixer MQ13 mixes the quadrature component carrier wave signal fLO' received from the quadrature component side filter FQ3 and the composite signal to demodulate the composite signal with the quadrature component carrier wave signal fLO' and outputs the quadrature component signal produced by the demodulation.

The in-phase component signal output by the in-phase component side second mixer MI13 and the quadrature component signal output by the quadrature component side second mixer MQ13 are then sent to, for example, a digital unit (not shown) provided downstream of analog quadrature demodulator of this embodiment to acquire receive data from the in-phase component signal and the quadrature component signal. When the frequency of the composite signal input to the analog quadrature demodulator of this embodiment varies, demodulation can be conducted over a broad band in response to the frequency variation of the composite signal by controlling the voltage-controlled oscillator VCO3 to vary its frequency according to the frequency of the composite signal.

The analog quadrature demodulator according to this embodiment can thus conduct demodulation over a broad frequency range by simple control even when incorporated in a wireless device or the like that transmits/receives signals over a broad band, without increasing the number of control system signals, cost or circuit size. Since the frequency of the signal f1 whose phase is shifted by the 90-degree phase shifter P2 is fixed, moreover, the accuracy of the 90-degree phase shift by the 90-degree phase shifter P2 can be ensured. The analog quadrature demodulator according this embodiment can, for example, control the demodulation processing over a broad band merely by conventional frequency control, e.g., by controlling the frequency of the voltage-controlled oscillator VCO3 according to the frequency of the composite signal.

In this embodiment, the local signal oscillator OSC2 and the 90-degree phase shifter P2 constitute the fixed frequency signal generating means, the voltage-controlled oscillator VCO3 constitutes the variable frequency signal generating means, the in-phase component side first mixer MI3 and filter FI3 constitute the in-phase component carrier wave signal generating means, the quadrature component side first mixer MQ3 and filter FQ3 constitute the quadrature component carrier wave signal generating means, the in-phase component side second mixer MI13 constitutes the in-phase component demodulating means, and the quadrature component side second mixer MQ13 constitutes the quadrature component demodulating means. In this embodiment, the in-phase component modulated signal (in-phase modulated component) and the quadrature component modulated signal (quadrature modulated component) are processed in the form of a synthesized composite signal.

A demodulator that is a fourth embodiment of the present invention will now be explained.

Figure 4:
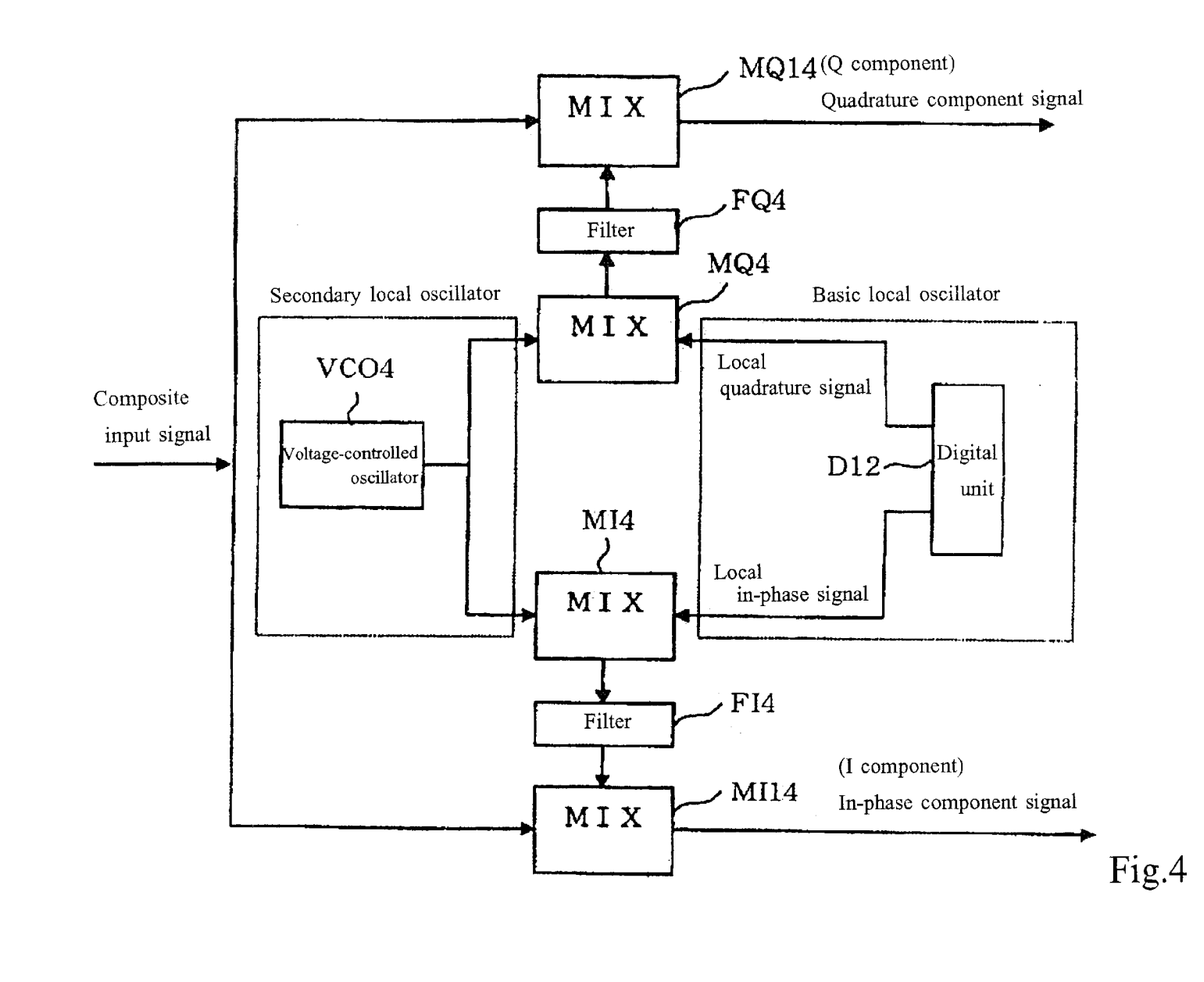
FIG. 4 is a diagram showing the configuration of an analog quadrature demodulator that is a fourth embodiment of the present invention.

FIG. 4 shows the configuration of the analog quadrature demodulator of this embodiment.

The illustrated analog quadrature demodulator of this embodiment comprises a digital unit D12 constituting a processing unit for generating a basic local signal, a voltage-controlled oscillator VCO4 constituting a processing unit for generating a secondary local signal, an in-phase component side first mixer MI4, filter FI4 and second mixer MI14, and a quadrature component side first mixer MQ4, filter FQ4 and second mixer MQ14. The analog quadrature demodulator of this embodiment is input with a composite signal transmitted wirelessly from, for example, a wireless device with which communication is to be conducted and received wirelessly via an antenna (not shown). The composite signal is divided by a distributor (not shown), for example. One divided signal is input to the in-phase component side second mixer MI14 and the other divided signal is input to the quadrature component side second mixer MQ14.

The configuration and operation of the analog quadrature demodulator of this embodiment are the same as the configuration and operation of the analog quadrature demodulator according to the third embodiment shown in FIG. 3, except for the point that the digital unit D12 generates the basic carrier wave frequency signal f1 and outputs the signal f1 to the in-phase component side first mixer MI4 and the point that the digital unit D12 generates the signal f1' equivalent to a signal obtained by shifting the phase of the signal f1 90 degrees and outputs the signal f1' to the quadrature component side first mixer MQ4, i.e., except for the configuration for generating the basic local signal.

In this embodiment, since the frequencies of the basic local signals f1, f1' input to the in-phase component side first mixer MI4 and the quadrature component side first mixer MQ4 are fixed, when the frequency is a relatively low one of, for example, 100 MHz or lower, it is easily possible, in consideration of spurious interference and the like, to have the digital unit D12 output the basic local signal f1 for the in-phase component and the basic local signal f1' for the quadrature component as digital signals.

Thus the analog quadrature demodulator according to this embodiment can, as was explained earlier regarding the analog quadrature demodulator according to the third embodiment, also conduct demodulation over a wide band with simple control.

In this embodiment, the digital unit D12 constitutes the fixed frequency signal generating means.

The configurations of the modulator and demodulator according to this invention are not limited to those set out in the foregoing and any of various other configurations can be adopted instead.

In addition, the field of application of the invention is not limited to that discussed in the foregoing and application in various other fields is also possible.

The modulator and demodulator of this invention are suitable for application in, for example, in the wireless communication devices of mobile communication systems such the wireless communication devices of an intelligent transport system, a mobile phone system and a Personal Handy phone System (PHS). However, they can also be applied in the communication equipment of various other kinds of systems. Moreover, application is not limited to wireless communication and application to wire communication is also possible.

In addition, the various types of processing performed in the modulator and demodulator according to this invention may be constituted by being implemented in hardware resources equipped with a processor and memory and the like, for example, being controlled by means of a processor executing a control program stored in ROM (Read Only Memory). Further, the various functional means for executing this processing may also be constituted as independent physical circuits.

In addition, the present invention may also be understood as the aforesaid program itself or as a Floppy Disk®, CD (compact disk)-ROM or other computer-readable recording media in which the program is stored, so that the processing according to the present invention can be implemented by loading said control program from the recording medium into a computer and executing the program by a processor.

As explained in the foregoing, the modulator according to the present invention is adapted such that, when modulating an in-phase component carrier wave signal with an in-phase component signal and modulating a quadrature component carrier wave signal with a quadrature component signal, it generates two basic local signals of fixed frequency differing 90 degrees in phase, generates a secondary local signal whose frequency can be varied according to a modulated signal to be produced, mixes one basic local signal and the secondary local signal to generate a carrier wave signal for an in-phase component, mixes the other basic local signal and the secondary local signal to generate a carrier wave signal for a quadrature component, modulates the generated in-phase component carrier wave signal with the in-phase component signal and modulates the generated quadrature component carrier wave signal with the quadrature component signal. Broadband modulation can therefore be achieved with simple control.

The demodulator according to the present invention is adapted such that, when demodulating an in-phase component modulated signal with an in-phase component carrier wave signal to produce an in-phase component signal and demodulating a quadrature component modulated signal with a quadrature component carrier wave signal to produce a quadrature component signal, it generates two basic local signals of fixed frequency differing 90 degrees in phase, generates a secondary local signal whose frequency can be varied according to a modulated signal, mixes one basic local signal and the secondary local signal to generate a carrier wave signal for an in-phase component, mixes the other basic local signal and the secondary local signal to generate a carrier wave signal for a quadrature component, demodulates an in-phase component modulated signal with the generated in-phase component carrier wave signal to produce an in-phase component signal, and demodulates a quadrature component modulated signal with the generated quadrature component carrier wave signal to produce a quadrature component signal. Broadband demodulation can therefore be achieved with simple control.

What is claimed is:

1. A modulator for modulating an in-phase component carrier wave signal with an in-phase component signal and modulating a quadrature component carrier wave signal with a quadrature component signal, the modulator comprising:

fixed frequency signal generating means for generating two signals of fixed frequency differing 90 degrees in phase;

variable frequency signal generating means for generating a signal whose frequency can be varied according to a modulated signal to be produced;

in-phase component carrier wave signal generating means for mixing one signal generated by the fixed frequency signal generating means and the signal generated by the variable frequency signal generating means to generate a carrier wave signal for an in-phase component;

quadrature component carrier wave signal generating means for mixing the other signal generated by the fixed frequency signal generating means and the signal generated by the variable frequency signal generating means to generate a carrier wave signal for a quadrature component;

in-phase component modulating means for modulating the in-phase component carrier wave signal generated by the in-phase component carrier wave signal generating means with the in-phase component signal; and quadrature component modulating means for modulating the quadrature component carrier wave signal generated by the quadrature component carrier wave signal generating means with the quadrature component signal.

2. A modulator according to claim 1, wherein:

the fixed frequency signal generating means is constituted using a local signal oscillator that generates a fixed frequency and a 90-degree phase shifter that shifts the phase of the signal generated by the local signal oscillator 90 degrees.

3. A modulator according to claim 2, wherein:

the variable frequency signal generating means is constituted by a voltage-controlled oscillator, the in-phase component carrier wave signal generating means is constituted by an in-phase component side first mixer and filter, the quadrature component carrier wave signal generating means is constituted by a quadrature component side first mixer and filter, the in-phase component modulating means is constituted by an in-phase component side second mixer, and the quadrature component modulating means is constituted by a quadrature component side second mixer;

the local signal oscillator generates a signal whose frequency constitutes a basic carrier wave frequency and outputs the signal to the 90-degree phase shifter and the in-phase component side first mixer;

the 90-degree phase shifter shifts the phase of the signal received from the local signal oscillator 90 degrees and outputs the phase-shifted signal to the quadrature component side first mixer;

the voltage-controlled oscillator generates a signal having a frequency corresponding to a voltage applied thereto and outputs the signal to the in-phase component side first mixer and the quadrature component side first mixer;

the in-phase component side first mixer mixes the signal received from the local signal oscillator and the signal received from the voltage-controlled oscillator and outputs the mixing result to the in-phase component side filter;

the in-phase component side filter removes unnecessary frequency components from the mixing result received from the in-phase component side first mixer by filtering and outputs the filtered signal to the in-phase component side second mixer as an in-phase component carrier wave signal;

the in-phase component side second mixer mixes the in-phase component carrier wave signal received from the in-phase component side filter and an in-phase component signal received from an external digital unit and outputs the result of modulating the in-phase component carrier wave signal with the in-phase component signal;

the quadrature component side first mixer mixes the signal received from the 90-degree phase shifter and the signal received from the voltage-controlled oscillator and outputs the mixing result to the quadrature component side filter;

the quadrature component side filter removes unnecessary frequency components from the mixing result received from the quadrature component side first mixer by filtering and outputs the filtered signal to the quadrature component side second mixer as a quadrature component carrier wave signal; and the quadrature component side second mixer mixes the quadrature component carrier wave signal received from the quadrature component side filter and a quadrature component signal received from the external digital unit and outputs the result of modulating the quadrature component carrier wave signal with the quadrature component signal.

4. A modulator according to claim 1, wherein:

the fixed frequency signal generating means is constituted by a digital unit, the variable frequency signal generating means is constituted by a voltage-controlled oscillator, the in-phase component carrier wave signal generating means is constituted by an in-phase component side first mixer and filter, the quadrature component carrier wave signal generating means is constituted by a quadrature component side first mixer and filter, the in-phase component modulating means is constituted by an in-phase component side second mixer, and the quadrature component modulating means is constituted by a quadrature component side second mixer;

the digital unit generates a basic carrier wave frequency signal and outputs the signal to the in-phase component side first mixer and generates a signal equivalent to a signal obtained by shifting the phase of the basic carrier wave frequency signal 90 degrees and outputs the signal to the quadrature component side first mixer;

the voltage-controlled oscillator generates a signal having a frequency corresponding to a voltage applied thereto and outputs the signal to the in-phase component side first mixer and the quadrature component side first mixer;

the in-phase component side first mixer mixes the signal received from the digital unit and the signal received from the voltage-controlled oscillator and outputs the mixing result to the in-phase component side filter;

the in-phase component side filter removes unnecessary frequency components from the mixing result received from the in-phase component side first mixer by filtering and outputs the filtered signal to the in-phase component side second mixer as an in-phase component carrier wave signal;

the in-phase component side second mixer mixes the in-phase component carrier wave signal received from the in-phase component side filter and an in-phase component signal received from an external digital unit and outputs the result of modulating the in-phase component carrier wave signal with the in-phase component signal;

the quadrature component side first mixer mixes the signal received from the digital unit and the signal received from the voltage-controlled oscillator and outputs the mixing result to the quadrature component side filter;

the quadrature component side filter removes unnecessary frequency components from the mixing result received from the quadrature component side first mixer by filtering and outputs the filtered signal to the quadrature component side second mixer as a quadrature component carrier wave signal; and the quadrature component side second mixer mixes the quadrature component carrier wave signal received from the quadrature component side filter and a quadrature component signal received from the external digital unit and outputs the result of modulating the quadrature component carrier wave signal with the quadrature component signal.

5. A communication device equipped with a modulator for modulating an in-phase component carrier wave signal with an in-phase component signal and modulating a quadrature component carrier wave signal with a quadrature component signal and adapted to conduct communication using carrier waves of multiple frequencies, modulate signals with the modulator and transmit the modulated signals, the modulator of the communication device comprising fixed frequency signal generating means for generating two signals of fixed frequency differing 90 degrees in phase; variable frequency signal generating means for generating a signal whose frequency can be varied according to a modulated signal to be produced; in-phase component carrier wave signal generating means for mixing one signal generated by the fixed frequency signal generating means and the signal generated by the variable frequency signal generating means to generate a carrier wave signal for an in-phase component; quadrature component carrier wave signal generating means for mixing the other signal generated by the fixed frequency signal generating means and the signal generated by the variable frequency signal generating means to generate a carrier wave signal for a quadrature component; in-phase component modulating means for modulating the in-phase component carrier wave signal generated by the in-phase component carrier wave signal generating means with the in-phase component signal; and quadrature component modulating means for modulating the quadrature component carrier wave signal generated by the quadrature component carrier wave signal generating means with the quadrature component signal.

6. A communication device according to claim 5, wherein:

the fixed frequency signal generating means is constituted using a local signal oscillator that generates a fixed frequency and a 90-degree phase shifter that shifts the phase of the signal generated by the local signal oscillator 90 degrees.

7. A communication device according to claim 6, wherein:

the variable frequency signal generating means is constituted by a voltage-controlled oscillator, the in-phase component carrier wave signal generating means is constituted by an in-phase component side first mixer and filter, the quadrature component carrier wave signal generating means is constituted by a quadrature component side first mixer and filter, the in-phase component modulating means is constituted by an in-phase component side second mixer, and the quadrature component modulating means is constituted by a quadrature component side second mixer;

the local signal oscillator generates a signal whose frequency constitutes a basic carrier wave frequency and outputs the signal to the 90-degree phase shifter and the in-phase component side first mixer;

the 90-degree phase shifter shifts the phase of the signal received from the local signal oscillator 90 degrees and outputs the phase-shifted signal to the quadrature component side first mixer;

the voltage-controlled oscillator generates a signal having a frequency corresponding to a voltage applied thereto and outputs the signal to the in-phase component side first mixer and the quadrature component side first mixer;

the in-phase component side first mixer mixes the signal received from the local signal oscillator and the signal received from the voltage-controlled oscillator and outputs the mixing results to the in-phase component side filter;

the in-phase component side filter removes unnecessary frequency components from the mixing result received from the in-phase component side first mixer by filtering and outputs the filtered signal to the in-phase component side second mixer as an in-phase component carrier wave signal;

the in-phase component side second mixer mixes the in-phase component carrier wave signal received from the in-phase component side filter and an in-phase component signal received from an external digital unit and outputs the result of modulating the in-phase component carrier wave signal with the in-phase component signal;

the quadrature component side first mixer mixes the signal received from the 90-degree phase shifter and the signal received from the voltage-controlled oscillator and outputs the mixing result to the quadrature component side filter;

the quadrature component side filter removes unnecessary frequency components from the mixing result received from the quadrature component side first mixer by filtering and outputs the filtered signal to the quadrature component side second mixer as a quadrature component carrier wave signal; and the quadrature component side second mixer mixes the quadrature component carrier wave signal received from the quadrature component side filter and a quadrature component signal received from the external digital unit and outputs the result of modulating the quadrature component carrier wave signal with the quadrature component signal.

8. A communication device according to claim 5, wherein:

the fixed frequency signal generating means is constituted by a digital unit, the variable frequency signal generating means is constituted by a voltage-controlled oscillator, the in-phase component carrier wave signal generating means is constituted by an in-phase component side first mixer and filter, the quadrature component carrier wave signal generating means is constituted by a quadrature component side first mixer and filter, the in-phase component modulating means is constituted by an in-phase component side second mixer, and the quadrature component modulating means is constituted by a quadrature component side second mixer;

the digital unit generates a basic carrier wave frequency signal and outputs the signal to the in-phase component side first mixer and generates a signal equivalent to a signal obtained by shifting the phase of the basic carrier wave frequency signal 90 degrees and outputs the signal to the quadrature component side first mixer;

the voltage-controlled oscillator generates a signal having a frequency corresponding to a voltage applied thereto and outputs the signal to the in-phase component side first mixer and the quadrature component side first mixer;

the in-phase component side first mixer mixes the signal received from the digital unit and the signal received from the voltage-controlled oscillator and outputs the mixing result to the in-phase component side filter;

the in-phase component side filter removes unnecessary frequency components from the mixing result received from the in-phase component side first mixer by filtering and outputs the filtered signal to the in-phase component side second mixer as an in-phase component carrier wave signal;

the in-phase component side second mixer mixes the in-phase component carrier wave signal received from the in-phase component side filter and an in-phase component signal received from an external digital unit and outputs the result of modulating the in-phase component carrier wave signal with the in-phase component signal;

the quadrature component side first mixer mixes the signal received from the digital unit and the signal received from the voltage-controlled oscillator and outputs the mixing result to the quadrature component side filter;

the quadrature component side filter removes unnecessary frequency components from the mixing result received from the quadrature component side first mixer by filtering and outputs the filtered signal to the quadrature component side second mixer as a quadrature component carrier wave signal; and the quadrature component side second mixer mixes the quadrature component carrier wave signal received from the quadrature component side filter and a quadrature component signal received from the external digital unit and outputs the result of modulating the quadrature component carrier wave signal with the quadrature component signal.

9. A device for processing a signal for an in-phase component with an in-phase component carrier wave signal and processing a signal for a quadrature component with a quadrature component carrier wave signal, said device comprising:

fixed frequency signal generating means for generating two signals of fixed frequency differing 90 degrees in phase;

variable frequency signal generating means for generating a signal whose frequency can be varied;

in-phase component carrier wave signal generating means for mixing one signal generated by said fixed frequency signal generating means and the signal generated by said variable frequency signal generating means to generate a carrier wave signal for an in-phase component;

quadrature component carrier wave signal generating means for mixing the other signal generated by said fixed frequency signal generating means and the signal generated by said variable frequency signal generating means to generate a carrier wave signal for a quadrature component;

in-phase component signal processing means for processing a signal for an in-phase component with the in-phase component carrier wave signal generated by said in-phase component carrier wave signal generating means; and quadrature component signal processing means for processing a signal for a quadrature component with the quadrature component carrier wave signal generated by said quadrature component carrier wave signal generating means.

* * * * *